(12) United States Patent
Endo et al.

(10) Patent No.: US 12,504,149 B2
(45) Date of Patent: Dec. 23, 2025

(54) LIGHT-EMITTING DEVICE

(71) Applicant: NICHIA CORPORATION, Tokushima (JP)

(72) Inventors: Yoshiki Endo, Tokushima (JP); Kazuya Tamura, Anan (JP)

(73) Assignee: NICHIA CORPORATION, Tokushima (JP)

( * ) Notice: Subject to any disclaimer, the term of this patent is extended or adjusted under 35 U.S.C. 154(b) by 0 days.

(21) Appl. No.: 18/989,391

(22) Filed: Dec. 20, 2024

(65) Prior Publication Data

US 2025/0207756 A1   Jun. 26, 2025

(30) Foreign Application Priority Data

Dec. 26, 2023   (JP) ................. 2023-219104

(51) Int. Cl.
| | |
|---|---|
| *F21V 5/04* | (2006.01) |
| *F21S 8/06* | (2006.01) |
| *F21V 3/06* | (2018.01) |
| *F21V 7/00* | (2006.01) |
| *F21V 17/10* | (2006.01) |
| *F21V 31/00* | (2006.01) |

(52) U.S. Cl.
CPC .............. *F21V 5/048* (2013.01); *F21V 5/046* (2013.01); *F21V 31/005* (2013.01)

(58) Field of Classification Search
CPC ......... F21V 5/048; F21V 31/005; F21V 5/046
USPC .................................................. 362/311.02
See application file for complete search history.

(56) References Cited

U.S. PATENT DOCUMENTS

| | | | | |
|---|---|---|---|---|
| 6,296,378 | B1 * | 10/2001 | Doyen .................... | B64C 27/52 362/390 |
| 8,272,768 | B2 * | 9/2012 | Kazmierski .............. | F21V 7/06 362/311.06 |
| 8,446,004 | B2 * | 5/2013 | Loh ..................... | H10H 20/8583 257/710 |
| 8,938,877 | B2 * | 1/2015 | Tessnow ................. | B64F 1/002 29/428 |
| 2017/0114253 | A1 | 4/2017 | Nakayama et al. | |
| 2018/0178247 | A1 | 6/2018 | Aizawa et al. | |

FOREIGN PATENT DOCUMENTS

| | | |
|---|---|---|
| JP | 2006-245032 | 9/2006 |
| JP | 2016-129215 | 7/2016 |
| JP | 2018-107333 | 7/2018 |
| JP | 2019-216205 | 12/2019 |
| WO | 2016/010043 | 1/2016 |

* cited by examiner

*Primary Examiner* — Laura K Tso
(74) *Attorney, Agent, or Firm* — IPUSA, PLLC

(57) ABSTRACT

A light-emitting device includes: a base member having an outer lateral surface, an upper surface meeting the outer lateral surface, and a recess on an upper surface side; a light-emitting element disposed in the recess; a lens disposed on the upper surface of the base member and including a lens portion and a flange portion; and a reflective member disposed in contact with the upper surface of the base member and a lateral surface of the flange portion.

8 Claims, 7 Drawing Sheets

LIGHT-EMITTING DEVICE

CROSS-REFERENCE TO RELATED APPLICATIONS

This application is based on and claims priority to Japanese Patent Application No. 2023-219104, filed on Dec. 26, 2023, the entire contents of which are incorporated herein by reference.

BACKGROUND

1. Technical Field

The present disclosure relates to a light-emitting device.

2. Description of Related Art

International Publication Pamphlet No. WO2016/010043 describes a light-emitting device that includes a lens disposed above a light-emitting element and in which an adhesive is provided on the lateral surfaces of the lens.

SUMMARY

An object of an embodiment of the present disclosure is to provide a light-emitting device that can improve light extraction efficiency.

A light-emitting device according to an embodiment of the present disclosure includes: a base member having an outer lateral surface, an upper surface meeting the outer lateral surface, and a recess on an upper surface side; a light-emitting element disposed in the recess; a lens disposed on the upper surface of the base member and including a lens portion and a flange portion; and a reflective member disposed in contact with the upper surface of the base member and a lateral surface of the flange portion.

DETAILED DESCRIPTION

Figure 1:
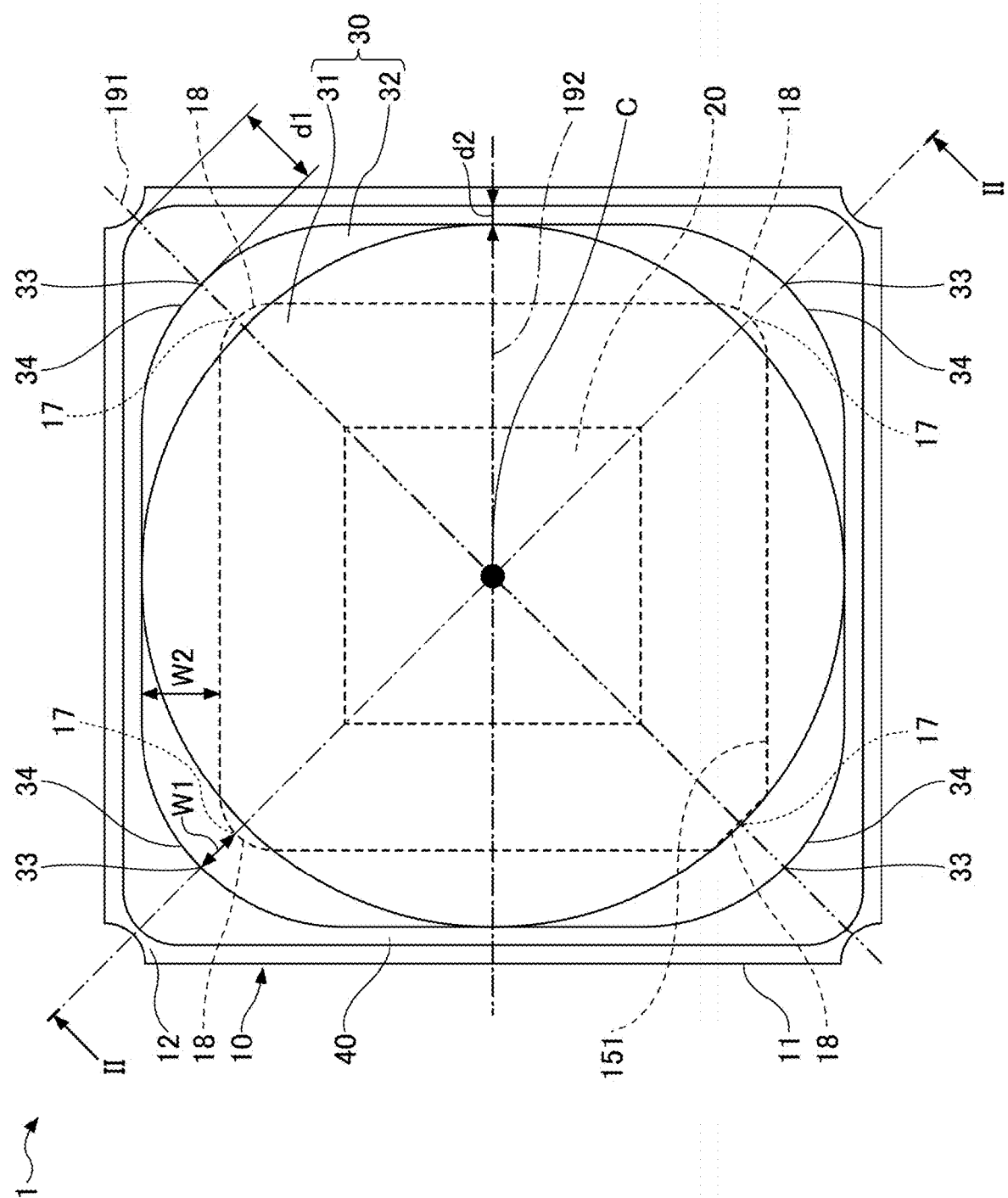
FIG. 1 is a schematic top view illustrating a light-emitting device according to a first embodiment.

Light-emitting devices according to embodiments of the present disclosure will be described in detail with reference to the accompanying drawings. The embodiments described below illustrate light-emitting devices that embody technical ideas underlying the present invention, but the present invention is not limited to the described embodiments. In addition, unless otherwise specified, the dimensions, materials, shapes, relative arrangements, and the like, of components described in the embodiments are not intended to limit the scope of the present disclosure thereto, but are described as examples. The sizes, positional relationships, and the like, of members illustrated in the drawings may be exaggerated for clearer illustration. Further, in the following description, the same names and reference numerals refer to the same or similar members, and a detailed description thereof will be omitted as appropriate.

In the following description, terms indicating specific directions and positions (for example, "upper", "upward", "lower", "downward", and other terms including these terms) may be used. These terms are merely used to facilitate understanding of relative positions, orientations, directions, and the like in the referenced drawings, and do not have to coincide with relationships during use of the light-emitting devices according to the embodiments. Further, these directions are irrelevant to the direction of gravity.

First Embodiment

Figure 2:
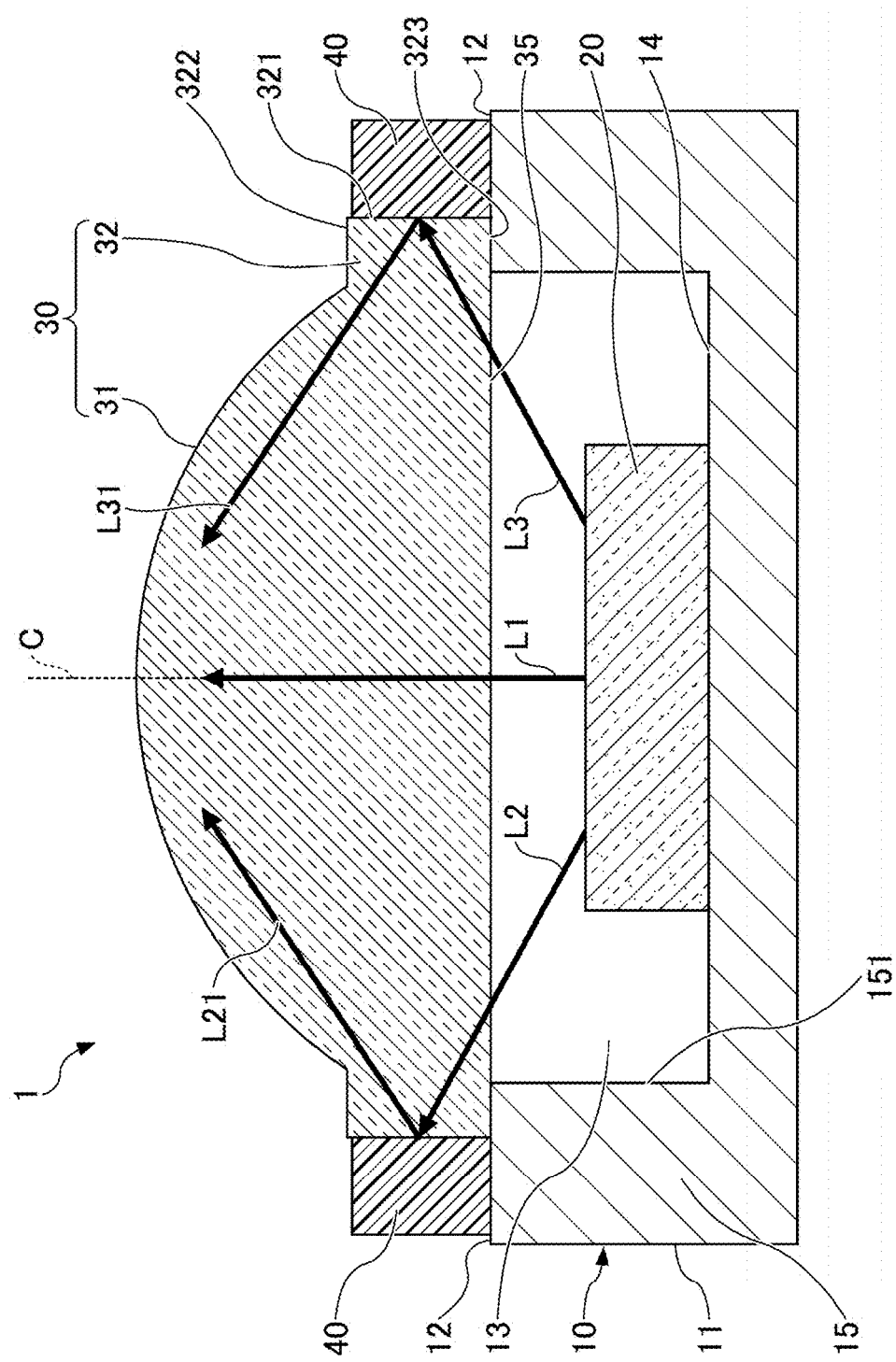
FIG. 2 is a schematic end view taken through line II-II of FIG. 1.

A configuration of a light-emitting device according to a first embodiment will be described with reference to FIG. 1 and FIG. 2. FIG. 1 is a schematic top view illustrating a configuration of a light-emitting device 1 according to the first embodiment. FIG. 2 is a schematic end view taken through line II-II of FIG. 1.

As illustrated in FIG. 1 and FIG. 2, the light-emitting device 1 includes a base member 10 having outer lateral surfaces 11, an upper surface 12 meeting the outer lateral surfaces 11, and a recess 13 on the upper surface 12 side, and a light-emitting element 20 disposed in the recess 13. The light-emitting device 1 further includes a lens 30 disposed on the upper surface 12 and including a lens portion 31 and a flange portion 32, and a reflective member 40 disposed in contact with the upper surface 12 of the base member 10 and lateral surfaces 321 of the flange portion 32.

In the example illustrated in FIG. 2, light L1 indicated by an arrow represents a portion of light, among light emitted from the light-emitting element 20, traveling toward the center of the lens portion 31 of the lens 30. Light L2 and light L3 indicated by arrows represent portions of light, among the light emitted from the light-emitting element 20, traveling toward the lateral surfaces 321 of the flange portion 32 of the lens 30. Light L21 indicated by an arrow represents light obtained by the light L2 being reflected by the reflective member 40. Light L31 indicated by an arrow represents light obtained by the light L3 being reflected by the reflective member 40. In the light-emitting device 1, light such as the light L2 and the light L3, among the light emitted from the light-emitting element 20, traveling toward the lateral surfaces 321 of the flange portion 32 of the lens 30 is reflected by the reflective member 40, and thus can be extracted from the light-emitting device 1. Accordingly, in the present embodiment, the light-emitting device 1 that can improve light extraction efficiency can be provided.

In the example illustrated in FIG. 1, the reflective member 40 surrounds the flange portion 32 in a top view. Further, the reflective member 40 is disposed in contact with the lateral surfaces 321 of the flange portion 32 so as to surround the flange portion 32. With this configuration, light traveling toward the lateral surfaces 321 of the flange portion 32 of the lens 30 can be extracted from the entire periphery of the lens 30 in a top view, and thus the light extraction efficiency of the light-emitting device 1 can be increased.

In the example illustrated in FIG. 1 and FIG. 2, the flange portion 32 has a rectangular shape including a curved surface 34 at corner portions 33 in a top view. As used herein, the "corner portion" refers to a region in the vicinity of an intersection point at which two sides meet. For example, if the flange portion 32 has a shape in which two sides meet at a corner portion so as to be orthogonal to each other in a top view, the distance between the corner portion at which the two sides meet and an optical axis of the lens 30 increases. In such a case, there would be a possibility that light reflected by the reflective member 40 located on the corner portion at which the two sides meet does not enter the lens 30. As a result, the amount of light that does not enter the lens 30 would be increased, and the light extraction efficiency of the light-emitting device 1 would be decreased. Conversely, in the present embodiment, the flange portion 32 has a rectangular shape including the curved surface 34 at the corner portions 33 in a top view, and thus the distance between the reflective member 40 located on the curved surface 34 of the corner portions 33 and an optical axis C of the lens 30 can be reduced. Accordingly, in the light-emitting device 1, the possibility that light reflected by the reflective member 40 does not enter the lens 30 can be reduced, and the light extraction efficiency of the light-emitting device 1 can be increased. The shape of the lens 30 in a top view is not limited to a rectangular shape, and may be a circular shape, an ellipse, a substantially polygonal shape, or the like.

The configuration of the light-emitting device 1 according to the first embodiment will be described in detail below.

(Base Member 10)

In the example illustrated in FIG. 1, the outer shape of the base member 10 is a substantially rectangular shape in a top view. The substantially rectangular shape includes a rectangular shape, a shape formed by removing a portion of corners of a rectangular shape, and a rectangular shape with rounded corners. The outer shape of the base member 10 in a top view is not limited to a rectangular shape, and may be a circular shape, an elliptical shape, a polygonal shape, or the like. In the example illustrated in FIG. 2, the upper surface 12 of the base member 10 is the upper surface of a lateral wall portion 15. The recess 13 is defined by inner lateral surfaces 151 of the lateral wall portion 15 and a bottom surface 14. The bottom surface 14 is the bottom of the recess 13.

The base member 10 is composed of an insulating base material as a main material. The insulating base material includes a ceramic. The ceramic preferably has high heat resistance and weather resistance. As the ceramic, for example, aluminum nitride, aluminum oxide, or mullite can be used.

(Light-Emitting Element 20)

The light-emitting element 20 emits ultraviolet light. For example, the peak wavelength of the ultraviolet light emitted from the light-emitting element 20 is 200 nm or more and 410 nm or less. The light-emitting element 20 is disposed on the bottom surface 14 of the base member 10. In a case where the light-emitting element 20 has a substantially rectangular shape in a top view, the light-emitting element 20 is preferably disposed such that a side of the light-emitting element 20 is substantially parallel to a side of the base member 10 in a top view. With such an arrangement, absorption of light, emitted from the light-emitting element 20, into the inner lateral surfaces 151 of the base member 10 can be reduced. Alternatively, the light-emitting element 20 may be disposed such that a bisector of an angle of a vertex of the light-emitting element 20 is perpendicularly parallel to a side of the base member 10 in a top view. The light-emitting element 20 is located in a space of the recess 13. The space of the recess 13 is defined by the inner lateral surfaces 151 of the lateral wall portion 15, the bottom surface 14, and a lower surface 35 of the lens 30. A lower surface 323 of the flange portion 32 is also the lower surface 35 of the lens 30.

(Lens 30)

The lens 30 transmits light emitted from the light-emitting element 20. The lens 30 can transmit light emitted from the light-emitting element 20 and converge or diverge the light to allow the light to be emitted. Converging the light includes collimating the light. The lens 30 is a plano-convex lens in which a surface facing the light-emitting element 20 is a flat surface, and a surface opposite to the surface facing the light-emitting element 20 is a convex surface. However, the lens 30 may be a plano-concave lens in which the surface opposite to the surface facing the light-emitting element 20 is a concave surface. Alternatively, the lens 30 may be a lens array having a plurality of convex surfaces or concave surfaces on the side opposite to the surface facing the light-emitting element 20. The lens 30 may be a Fresnel lens, a diffractive lens, or the like.

In a top view, the length of the lens 30 is shorter than the length of the base member 10 in a direction perpendicular to one side of the base member 10. Further, in a top view, the length of the lens 30 is shorter than the length of the base member 10 in each of a direction perpendicular to and a direction parallel to one side of the base member 10. With such a configuration, a region where the reflective member 40 is disposed on the lateral surfaces 321 of the flange portion 32 of the lens 30 can be secured.

The lens 30 includes a light-transmissive glass (such as borosilicate glass or quartz glass) material or the like. As for the light transmissivity of the lens 30, it is preferable to have a light transmittance of 60% or more, and even more preferable to have a light transmittance of 90% or more, with respect to the peak wavelength of light emitted from the light-emitting element 20.

The lens portion 31 has a lens surface and functions as a lens. In the lens 30, a portion overlapping the lens surface in a side view can be defined as the lens portion 31. A portion of the outer edge of the lens portion 31 overlaps the upper surface 12 of the base member 10 in a top view. Further, another portion of the outer edge of the lens portion 31 overlaps the recess 13 of the base member 10 in a top view.

The flange portion 32 is a portion provided on the lower side of the lens portion 31. In other words, the lens 30 has a shape in which the lens portion 31 is provided on the flange portion 32. The flange portion 32 has the lateral surfaces 321, an upper surface 322 meeting the lateral surfaces 321, and the lower surface 323 located opposite to the upper surface 322. The lens 30 can be stably fixed to the base member 10 by including the flange portion 32.

(Reflective Member 40)

For example, a white resin or a resin containing metal powder, a white paint or a paint containing metal powder, a metal film, a metal foil, a metal plate, or the like can be used for the reflective member 40. As a base material of the reflective member 40, an inorganic material such as an inorganic polymer can be used. Examples of the inorganic material include ceramic-based materials, cement-based materials, sodium silicate, and aluminum phosphate. Further, a mixture containing silica and an alkali metal may be used as the inorganic material. The reflective member 40 is a member obtained by curing a resin or a paint.

In a case where a resin or a paint is used as the reflective member 40, the resin or the paint is applied onto the upper surface 12 and the lateral surfaces 321 of the flange portion 32 in a state of having fluidity. Thereafter, the resin or the paint is dried, and as a result, the resin or the paint serving as the reflective member 40 is disposed in contact with the upper surface 12 and the lateral surfaces 321 of the flange portion 32. However, because the resin or the paint, which is to serve as the reflective member 40, has fluidity when being applied onto the upper surface 12 and the lateral surfaces 321 of the flange portion 32, there would be a possibility that the resin or the paint leaks to the outside of the base member 10. In the light-emitting device 1 illustrated in FIG. 1, the lens 30 is smaller than the base member 10 in a top view, and thus there is a space where the resin or the paint is retained on the upper surface 12 of the base member 10. Accordingly, the possibility that the resin or the paint having fluidity leaks to the outside of the base member 10 can be reduced, and thus the reflective member 40 can be stably disposed.

The proportion of the area covered by the reflective member 40 relative to the surface area of the lateral surfaces 321 of the flange portion 32 of the lens 30 is preferably 95% or more and 100% or less. By setting the proportion of the area covered by the reflective member 40 within the above range, the light extraction efficiency of the light-emitting device 1 can be further increased. Further, the reflective member 40 is preferably bonded not only to the lateral surfaces 321 but also to the upper surface 12 of the base member 10. With this configuration, the bonding strength between the lens 30 and the base member 10 can be increased via the reflective member 40.

A width d1 of the reflective member 40 on a diagonal 191 of the base member 10 in a top view is, for example, 0.1 mm or more and 0.37 mm or less. By setting the width d1 to be 0.1 mm or more, light traveling toward the lateral surfaces 321 of the flange portion 32 of the lens 30 can be sufficiently reflected. Further, by setting the width d1 to be 0.37 mm or less, the possibility that the reflective member 40 is applied beyond the outer edge of the base member 10 in a top view can be reduced. Further, a width d2 of the reflective member 40 on a perpendicular bisector 192 of one side of the base member 10 in a top view is, for example, 0.05 mm or more and 0.1 mm or less. By setting the width d2 to be 0.05 mm or more, the bonding strength between the reflective member 40 and the base member 10 can be increased. Further, by setting the width d2 to be 0.1 mm or less, the possibility that the reflective member 40 is applied beyond the outer edge of the base member 10 in a top view can be reduced.

In the example illustrated in FIG. 1, the recess 13 has a rectangular shape including a curved surface 18 at corner portions 17 in a top view. In a top view, the width d1 of the reflective member 40 on the diagonal 191 of the base member 10 is greater than the width d2 of the reflective members 40 on the perpendicular bisector 192 of one side of the base member 10. By setting the width d1 to be greater than the width d2, the reflective member 40 provided on the corner portions 33 of the flange portion 32 has a larger area than the area of the reflective member 40 provided on a portion other than the corner portions 33 in a top view. Accordingly, the bonding strength between the base member 10 and the lens 30 can be increased.

Further, in the example illustrated in FIG. 1, in a top view, a width W1 of an overlapping portion between the lens 30 and the upper surface 12 of the base member 10 at the corner portions 17 is smaller than a width W2 of the overlapping portion between the lens 30 and the upper surface 12 of the base member 10 at a portion where a bonding member is disposed. In a top view, the area of the overlapping portion between the base member 10 and the flange portion 32 is smaller at the corner portions 33 than at a portion other than the corner portions 33. If the area of the flange portion 32 bonded by the reflective member 40 is small, the bonding strength between the base member 10 and the lens 30 would be decreased. In the present embodiment, by providing the bonding member at a portion other than the corner portions 33 of the flange portion 32, a decrease in the bonding strength between the base member 10 and the lens 30 can be reduced.

Second Embodiment

Next, a configuration of a light-emitting device according to a second embodiment will be described. The same names and reference numerals as those in the above-described embodiment denote the same or similar members or configurations, and a detailed description thereof will be omitted as appropriate. The same applies to embodiments to be described later.

Figure 3:
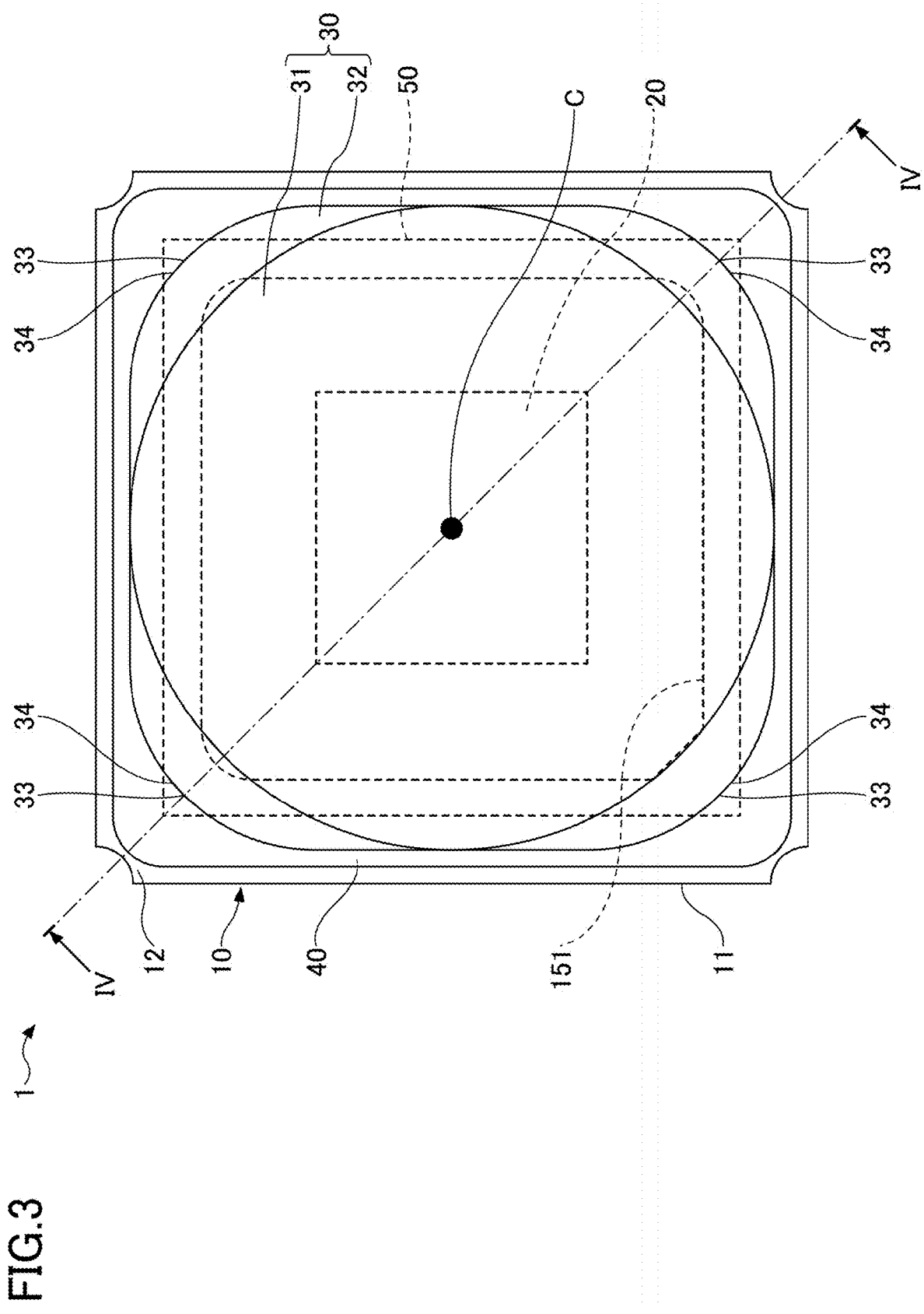
FIG. 3 is a schematic top view illustrating a light-emitting device according to a second embodiment.
Figure 4:
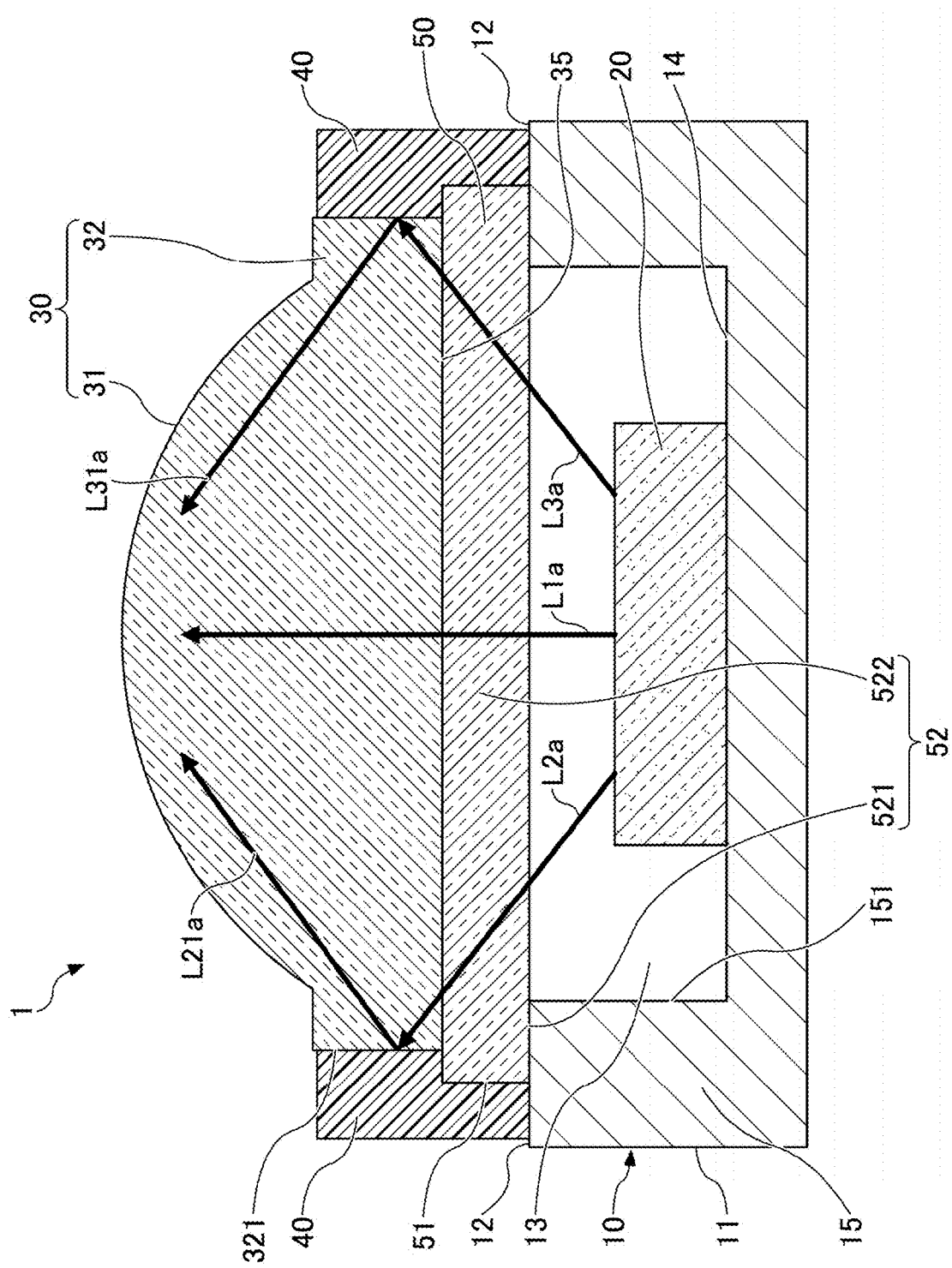
FIG. 4 is a schematic end view taken through line IV-IV of FIG. 3.

FIG. 3 is a schematic top view illustrating an example of a light-emitting device 1 according to the second embodiment. FIG. 4 is a schematic end view taken through line IV-IV of FIG. 3.

As illustrated in FIG. 3 and FIG. 4, the light-emitting device 1 according to the second embodiment differs from the light-emitting device according to the first embodiment mainly in that the light-emitting device 1 according to the second embodiment includes a light transmissive member 50 disposed between the lens 30 and the light-emitting element 20, and a reflective member 40 is disposed in contact with the lateral surfaces 321 of the flange portion 32 of the lens 30 and lateral surfaces 51 of the light transmissive member 50.

In the present embodiment, the lens 30 is disposed on a base member 10 with the light-transmissive member 50 interposed therebetween. For example, if the lens 30 is directly bonded to the base member 10, there would be a possibility that the bonding between the base member 10 and the lens 30 becomes unstable due to a difference in thermal expansion coefficient between the base member 10 and the lens 30. Disposing the lens 30 on the base member 10 with the light-transmissive member interposed therebetween allows the lens 30 to be stably fixed. In the example illustrated in FIG. 3 and FIG. 4, light L1a indicated by an arrow represents a portion of light, among light emitted from the light-emitting element 20, traveling toward the center of the lens portion 31 of the lens 30. Light L2a and light L3a indicated by arrows represent portions of light, among the light emitted from the light-emitting element 20, traveling toward the lateral surfaces 321 of the flange portion 32 of the lens 30 and the lateral surfaces 51 of the light transmissive member 50. Light L21a indicated by an arrow represents light obtained by the light L2a being reflected by the reflective member 40. Light L31a indicated by an arrow represents light obtained by the light L3 being reflected by the reflective member 40. In the present embodiment, light such as the light L2a and the light L3a, among the light emitted from the light-emitting element 20, traveling toward the lateral surfaces 321 of the flange portion 32 of the lens 30 and the lateral surfaces 51 of the light transmissive member 50 is reflected by the reflective member 40, and thus can be extracted from the light-emitting device 1. As described above, in the present embodiment, the light-emitting device 1 that can improve light extraction efficiency while allowing the lens 30 to be stably fixed can be provided.

The light transmissive member 50 is disposed on the upper surface 12 of the base member 10. The light transmissive member 50 is a member having light transmissivity that transmits at least the light emitted from the light-emitting element 20. The light transmissive member 50 transmits 60% or more and preferably 90% or more of the light emitted from the light-emitting element 20.

The light transmissive member 50 is disposed on the base member 10 so as to cover a space in the recess 13 in which the light-emitting element 20 is disposed. Covering the space in the recess 13 by the light transmissive member 50 allows the light-emitting element 20 to be protected from moisture, organic substances, and the like contained in the outside air. A lower surface 52 of the light transmissive member 50 includes a first region 521, located directly on the upper surface 12 of the base member 10, and a second region 522 located directly above the bottom surface 14. The second region 522 faces the upper surface of the light-emitting element 20 across the space in the recess 13.

The light transmissive member 50 has a plate-like outer shape. The light transmissive member 50 has a rectangular shape in a top view. Corner portions of the light-transmissive member 50 may be chamfered or the like. The shape of the light transmissive member 50 can be selected as appropriate according to the intended use or the like of the light-emitting device 1. From the viewpoint of increasing the airtightness of the space in the recess 13 by covering the space in the recess 13, it is preferable that at least the lower surface 52 of the light transmissive member 50 is a flat surface.

The length of the light-transmissive member 50 is shorter than the length of the base member 10 in a direction perpendicular to one side of the base member 10 in a top view. Further, the length of the light transmissive member 50 is shorter than the length of the base member 10 in each of a direction perpendicular to and a direction parallel to one side of the base member 10 in a top view. With such a configuration, a region where the reflective member 40 is disposed on each of the lateral surfaces 321 of the flange portion 32 of the lens 30 and the lateral surfaces 51 of the light transmissive member 50 can be secured.

In the example illustrated in FIG. 3 and FIG. 4, the light transmissive member 50 contains sapphire. When the base material of the base member 10 contains a ceramic, a difference in linear expansion coefficient between sapphire and the ceramic is small. Accordingly, in a case where the light-transmissive member 50 contains sapphire, even when the temperature around the light-emitting device 1 changes, an expansion difference between the base member 10 and the light transmissive member 50 can be reduced, and thus stress exerted due to the expansion difference between the base member 10 and the light transmissive member 50 can be reduced. In addition, a decrease in the bonding force between the base member 10 and the light transmissive member 50 using a bonding member can be reduced. However, the material of the light transmissive member 50 is not limited to sapphire, and can be selected as appropriate according to the application of the light-emitting device 1, the material of the base member 10, or the like.

Third Embodiment

Figure 5:
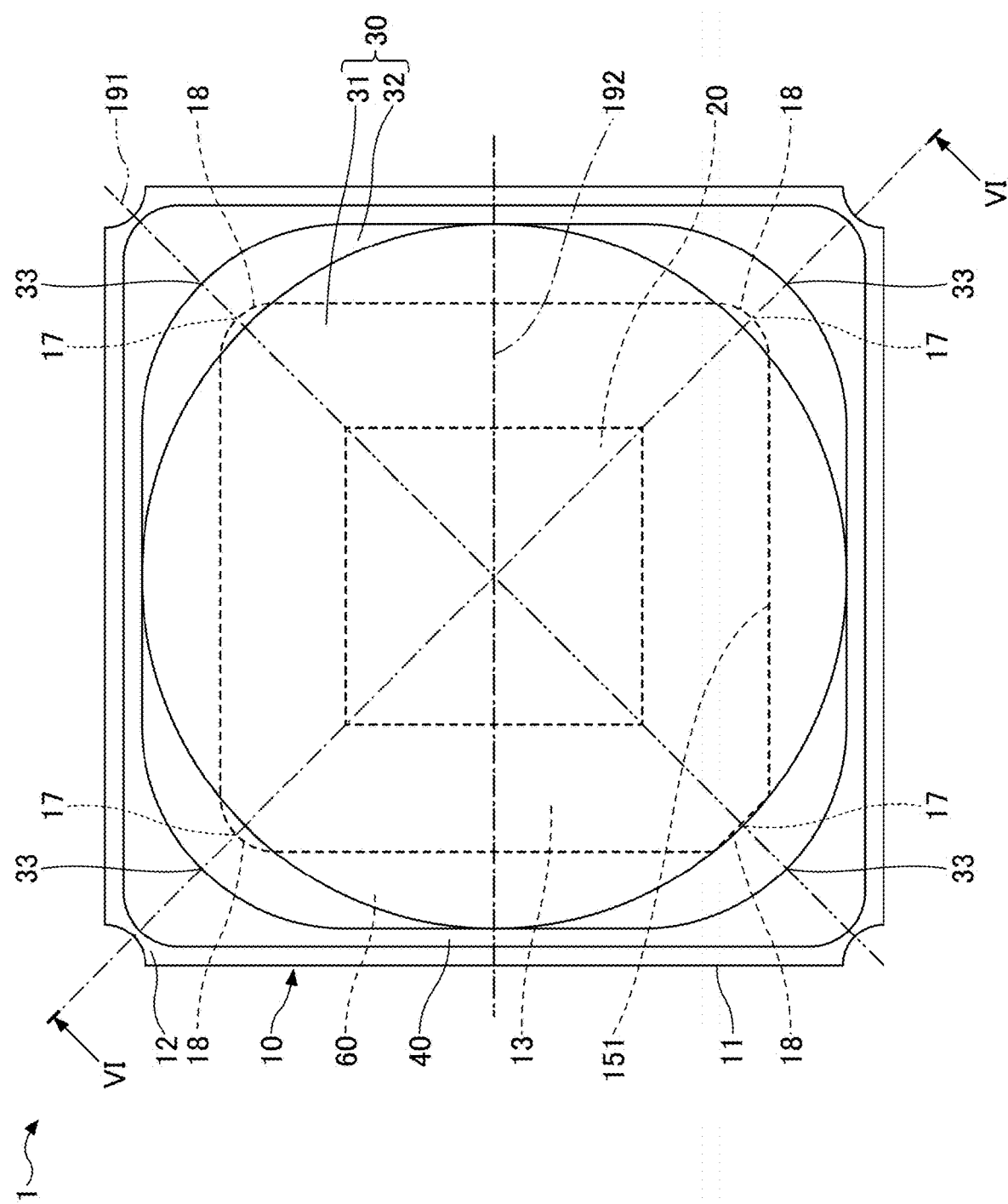
FIG. 5 is a schematic top view illustrating a light-emitting device according to a third embodiment.
Figure 6:
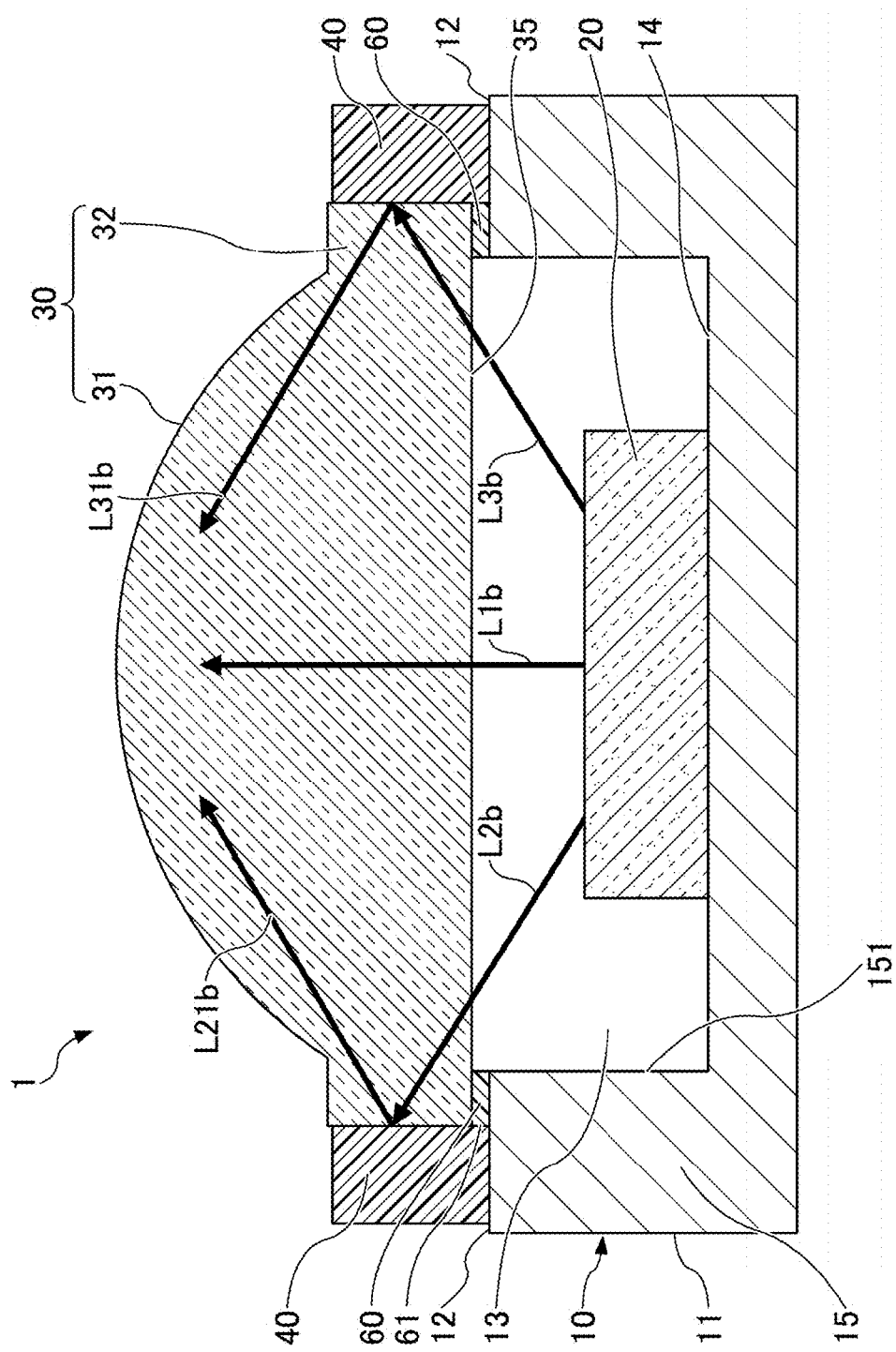
FIG. 6 is a schematic end view taken through line VI-VI of FIG. 5.

A configuration of a light-emitting device according to a third embodiment will be described with reference to FIG. 5 and FIG. 6. FIG. 5 is a schematic top view illustrating an example of a light-emitting device 1 according to the third embodiment. FIG. 6 is a schematic end view taken through line VI-VI of FIG. 5.

As illustrated in FIG. 5 and FIG. 6, a light-emitting device 1 according to the third embodiment differs from the light-emitting device according to the first embodiment mainly in that the light-emitting device 1 according to the third embodiment further includes a bonding member 60 configured to bond the lens 30 to the upper surface 12 of the base member 10, and the reflective member 40 contacts the bonding member 60.

In the example illustrated in FIG. 5 and FIG. 6, the bonding member 60 is disposed between the lower surface 35 of the lens 30 and the upper surface 12 of the base member 10. The reflective member 40 is disposed in contact with lateral surfaces 61 of the bonding member 60.

The bonding member 60 bonds the lens 30 to the base member 10. The bonding member 60 is an adhesive member composed of a metal material such as gold tin, a solder alloy, a brazing material, or the like as a base material. Alternatively, for example, the bonding member 60 may be an adhesive member composed of an inorganic material such as an inorganic polymer as a base material. Examples of the inorganic material include ceramic-based materials, cement-based materials, sodium silicate, and aluminum phosphate. Further, a mixture containing silica and an alkali metal may be used as the inorganic material. The reflective member 40 is a member obtained by curing a resin or a paint.

In the present embodiment, metal films are disposed on the base member 10 and the lens 30, and the metal films may be bonded together by the bonding member 60. In this manner, a space in the recess 13 can be sealed. By using the bonding member 60 to bond the base member 10 and the lens 30 so as to maintain the space in the recess 13 in an airtight state, deterioration of the light-emitting element 20 can be suppressed.

In the example illustrated in FIG. 6, light L1$b$ indicated by an arrow represents a portion of light, among light emitted from the light-emitting element 20, traveling toward the center of the lens portion 31 of the lens 30. Light L2$b$ and light L3$b$ indicated by arrows represent portions of light, among the light emitted from the light-emitting element 20, passing through the bonding member 60 disposed between the lower surface 35 of the lens 30 and the upper surface 12 of the base member 10, and traveling toward the lateral surfaces 321 of the flange portion 32 of the lens 30. light L21$b$ indicated by an arrow represents light obtained by the light L2$b$ being reflected by the reflective member 40. Light L31$b$ indicated by an arrow represents light obtained by the light L3$b$ being reflected by the reflective member 40. In the light-emitting device 1 according to the third embodiment, the reflective member 40 is disposed in contact with the lateral surfaces 61 of the bonding member 60. Accordingly, light such as the light L2$b$ and the light L3$b$, among the light emitted from the light-emitting element 20, traveling toward the lateral surfaces 321 of the flange portion 32 of the lens 30 is reflected by the reflective member 40, and thus can be extracted from the light-emitting device 1. As a result, the light extraction efficiency of the light-emitting device 1 can be increased.

Fourth Embodiment

Figure 7:
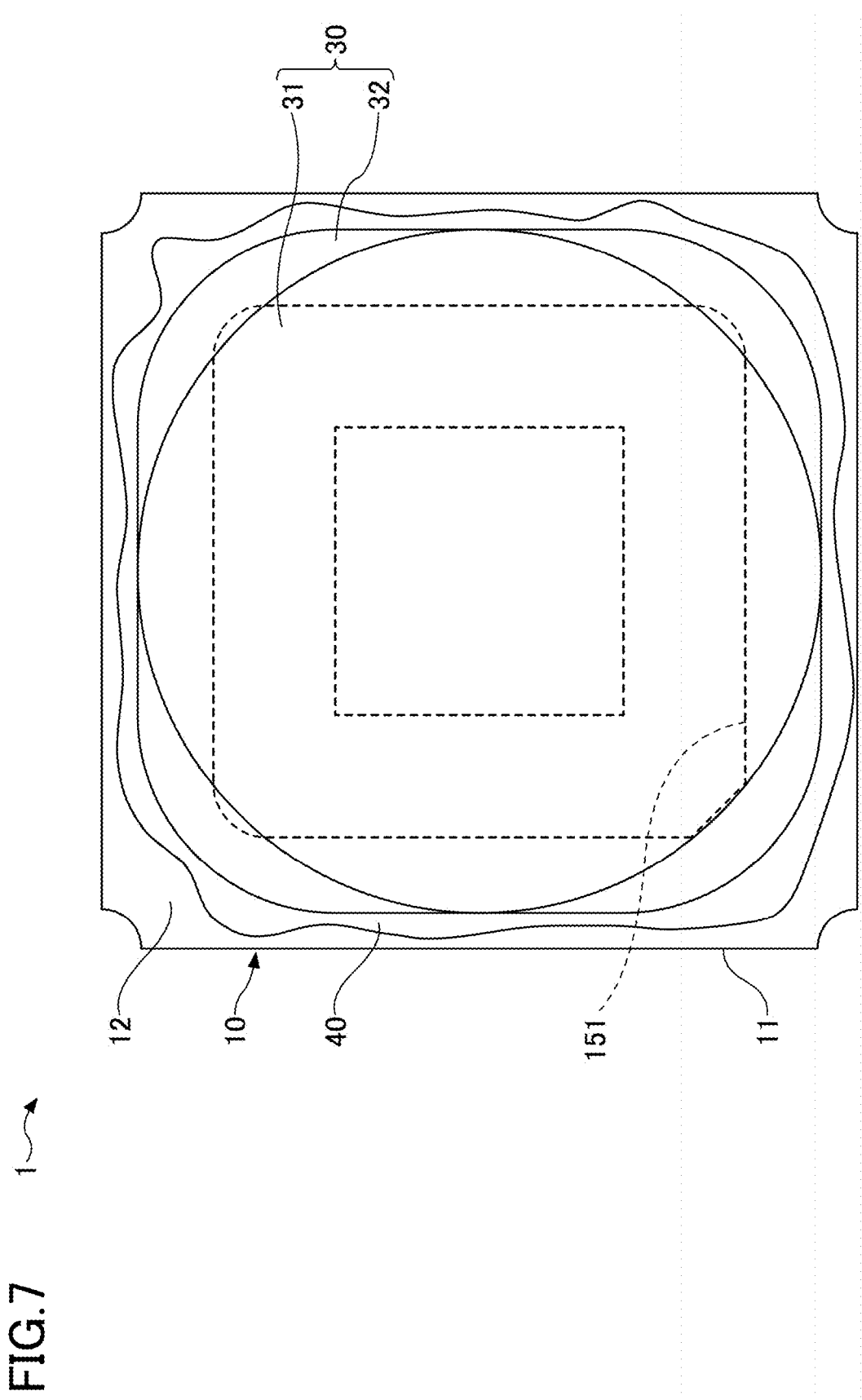
FIG. 7 is a schematic top view illustrating a light-emitting device according to a fourth embodiment.

A configuration of a light-emitting device according to a fourth embodiment will be described with reference to FIG. 7. FIG. 7 is a schematic top view illustrating an example of a light-emitting device 1 according to the fourth embodiment.

As illustrated in FIG. 7, the light-emitting device 1 according to the fourth embodiment differs from the light-emitting device according to the first embodiment mainly in that the shape of the outer edge of a reflective member 40 is an irregular curved shape in a top view.

Because the shape of the outer edge of the reflective member 40 is an irregular curved shape in a top view, the reflective member 40 can be easily provided on the upper surface 12 of the base member and the lateral surfaces 321 of the flange portion 32. Accordingly, the light-emitting device 1 can be easily manufactured.

Although embodiments have been described in detail above, the above-described embodiments are non-limiting examples, and various modifications and substitutions can be made to the above-described embodiments without departing from the scope described in the claims.

The numbers such as ordinal numbers and quantities used in the description of the embodiments are all exemplified to specifically describe the technique of the present disclosure, and the present disclosure is not limited to the exemplified numbers. In addition, the connection relationship between the components is illustrated for specifically describing the technique of the present disclosure, and the connection relationship for implementing the functions of the present disclosure is not limited thereto.

The light-emitting devices according to the present disclosure can improve light extraction efficiency, and thus can be suitably used in applications such as printing and exposure in which ultraviolet light is emitted to an object in order to cure the object. However, the light-emitting devices of the present disclosure are not limited to these applications.

According to an embodiment of the present disclosure, a light-emitting device that can improve light extraction efficiency can be provided.

What is claimed is:

1. A light-emitting device comprising:
    a base member having an outer lateral surface, an upper surface meeting the outer lateral surface, and a recess on an upper surface side;
    a light-emitting element disposed in the recess;
    a lens disposed on the upper surface of the base member and including a lens portion and a flange portion;
    a reflective member disposed in contact with the upper surface of the base member and a lateral surface of the flange portion; and
    a light transmissive member disposed between the lens and the light-emitting element,
    wherein the reflective member is disposed in contact with each of the lateral surface of the flange portion of the lens and a lateral surface of the light transmissive member.

2. The light-emitting device according to claim 1, wherein the reflective member surrounds the flange portion in a top view.

3. The light-emitting device according to claim 1, wherein the lens is smaller than the base member in a top view.

4. A light-emitting device comprising:
    a base member having an outer lateral surface, an upper surface meeting the outer lateral surface, and a recess on an upper surface side;
    a light-emitting element disposed in the recess;
    a lens disposed on the upper surface of the base member and including a lens portion and a flange portion; and
    a reflective member disposed in contact with the upper surface of the base member and a lateral surface of the flange portion,
    wherein the flange portion has a rectangular shape including a curved surface at a corner portion in a top view.

5. The light-emitting device according to claim 4, further comprising:
    a bonding member configured to bond the lens to the upper surface of the base member, wherein
    the reflective member contacts the bonding member.

6. The light-emitting device according to claim 4, wherein a width of the reflective member on a diagonal of the base member is greater than a width of the reflective member on a perpendicular bisector of a side of the base member in the top view.

7. The light-emitting device according to claim 4, further comprising:
    a bonding member configured to bond the lens to the upper surface of the base member, wherein
    the recess has a rectangular shape including a curved surface at a corner portion in the top view, and
    a width of an overlapping portion between the lens and the upper surface of the base member in the top view is smaller at the corner portion than at a portion other than the corner portion.

8. The light-emitting device according to claim 1, wherein a shape of an outer edge of the reflective member is an irregular curved shape in a top view.

* * * * *